United States Patent
Sidiropoulos et al.

(10) Patent No.: US 6,522,199 B2
(45) Date of Patent: Feb. 18, 2003

(54) RECONFIGURABLE DUAL-MODE MULTIPLE STAGE OPERATIONAL AMPLIFIERS

(75) Inventors: Stefanos Sidiropoulos, Palo Alto, CA (US); Yingxuan Li, Cupertino, CA (US)

(73) Assignee: Rambus, Inc., Los Altos, CA (US)

( * ) Notice: Subject to any disclaimer, the term of this patent is extended or adjusted under 35 U.S.C. 154(b) by 76 days.

(21) Appl. No.: 09/861,246

(22) Filed: May 18, 2001

(65) Prior Publication Data

US 2002/0171487 A1 Nov. 21, 2002

(51) Int. Cl.[7] .............................. H03F 3/45; H03F 1/14; H03F 1/02
(52) U.S. Cl. ............................ 330/253; 330/292; 330/9
(58) Field of Search ............................ 330/9, 253, 292

(56) References Cited

U.S. PATENT DOCUMENTS

| | | | | |
|---|---|---|---|---|
| 4,210,872 A | * | 7/1980 | Gregorian | 330/107 |
| 5,825,250 A | * | 10/1998 | Tomasini et al. | 330/292 |
| 5,854,573 A | * | 12/1998 | Chan | 330/107 |
| 5,880,634 A | * | 3/1999 | Babanezhad | 327/557 |

OTHER PUBLICATIONS

"A High–Slew Integrator for Switched–Capacitor Circuits", Appendix A, pp. 113–124.
"MOS Operational Amplifier Design–A Tutorial Overview", Gray and Meyer, IEEE Journal of Solid–State Circuits, vol. SC–17, No. 6, Dec. 1982, pp. 969–982.

* cited by examiner

Primary Examiner—Patricia Nguyen
(74) Attorney, Agent, or Firm—Lee & Hayes, PLLC

(57) ABSTRACT

A reconfigurable dual-mode multiple stage operational amplifier circuit includes a configurable portion that can be selectively configured to operate in either a one-pole mode or a two-pole mode. Different exemplary operational amplifier circuits are provided, some of which employ a compensation portion that can be selectively coupled to the configurable portion. For example, in the one-pole operating mode the compensation portion is decoupled from an output of the configurable portion. Conversely, in the two-pole operating mode the compensation portion is coupled to the output. The compensation portion is configured to stabilize a signal on the output. The configurable portion switches between operational modes in response to at least one control signal. The operational amplifier may include a pulse generating portion that is coupled to operatively control the configurable portion in response to the at least one control signal. Such an implementation negates the need for a compensation portion.

21 Claims, 9 Drawing Sheets

RECONFIGURABLE DUAL-MODE MULTIPLE STAGE OPERATIONAL AMPLIFIERS

TECHNICAL FIELD

This invention relates to operational amplifiers, and more particularly to dual-mode multiple stage operational amplifiers.

BACKGROUND

Two-stage CMOS operational amplifiers are advantageous in many circuits because they are able to provide a large transconductance, a fast settling time and sufficiently high gain.

Two-stage operational amplifier techniques are well known. Certain common two-stage operational amplifiers include compensation components, such as, for example, a nulling resistor, and/or pole-splitting capacitor, configured to generate a zero and separate a dominant pole and a second order pole.

Compensating a two-stage operational amplifier presents a challenge in a CMOS process that does not include a capacitor layer. One area-effective way to create a capacitor, is to utilize the gate capacitance of a MOSFET device with a formed channel. To keep the compensation capacitor turned on, however, the voltage difference between the two operational amplifier stages needs to be larger than the MOSFET threshold voltage under all of the process, supply, and temperature conditions. Such a solution may not be suitable for certain devices.

Thus, there is a continuing need for improved operational amplifiers that are suitable for implementation in a CMOS integrated circuitry and perhaps other types of circuitry.

BRIEF DESCRIPTION OF THE DRAWINGS

A more complete understanding of the various methods and arrangements of the present invention may be had by reference to the following detailed description when taken in conjunction with the accompanying drawings wherein.

DETAILED DESCRIPTION

Figure 1:
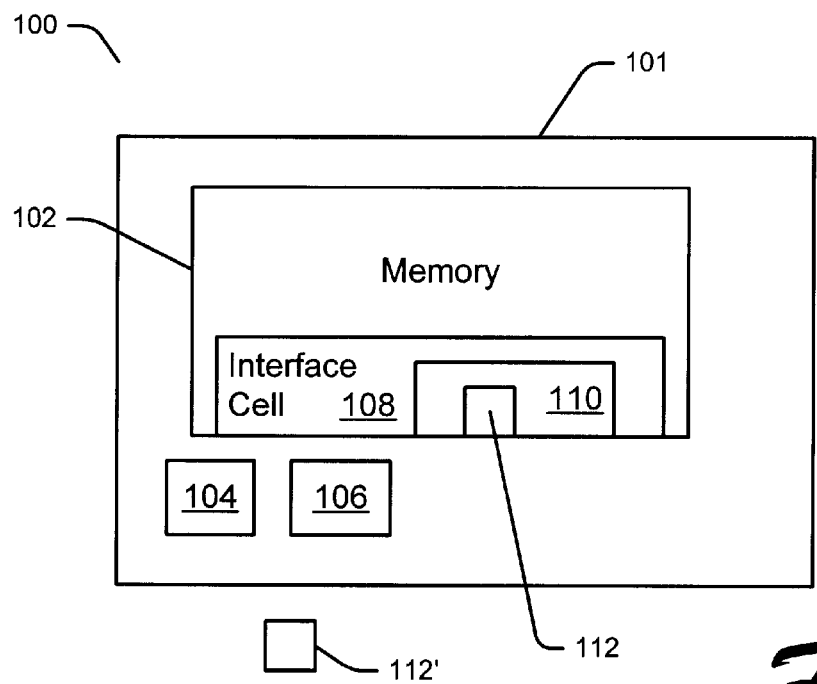
FIG. 1. is a block diagram depicting a device having various component circuits including a memory module that includes an interface cell with output circuitry suitable for employing an operational amplifier in accordance with certain implementations of the present invention.

FIG. 1 is a block diagram depicting a device 100, e.g., a computer or like appliance, having a main circuit board 101 configured to interconnect a memory device 102 to a processor 104, for example through a chip set 106. As depicted, memory device 102 includes an interface cell 108. Interface cell 108 includes an output subsystem 110 having an output driver circuit 112.

FIG. 1 is just an exemplary implementation that includes an output driver circuit 112. Those skilled in the art will recognize that an output driver circuit 112' may also be a separate circuit, or part of another circuit too. The description that follows will, however, focus on certain exemplary implementations of output driver circuit 112 as used in memory device 102, and more specifically on an operational amplifier portion of output driver circuit 112.

In certain conventional output subsystems 112, output driver transistors are arranged in a geometric series of legs allowing $2^7$ levels of output current. The legs of the output driver circuit 112 are formed by a plurality of two-transistor stacks (see, e.g., stack 210 in FIG. 2). Here, the bottom transistor is driven by an output pre-driver that carries the output data.

Figure 2:
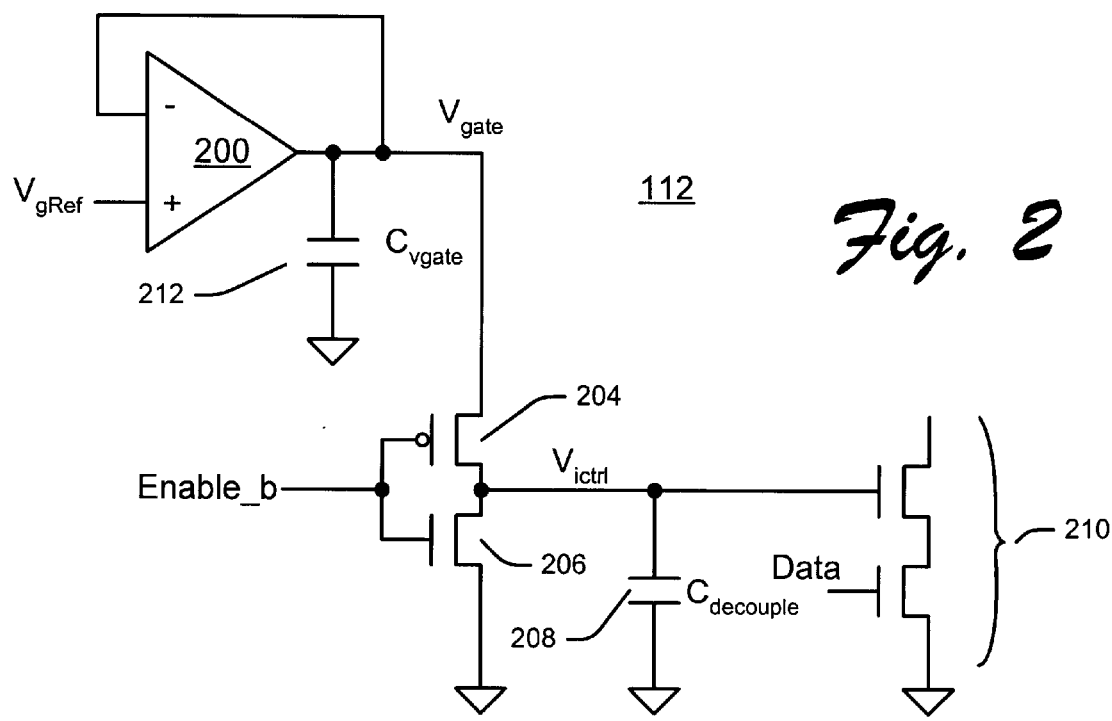
FIG. 2 is a schematic diagram depicting an exemplary output circuit, as in FIG. 1.

The output subsystem circuit 112 shown in FIG. 2 is a simplified diagram of an output subsystem circuit having an operational amplifier 200. Here, the output impedance of the output driver circuit 112 is significantly controlled by a $V_{ictrl}$ voltage on the upper transistor of the output stacks 210. Current control is accomplished by connecting the gate nodes of the upper transistors to the outputs of the $V_{gate}$ distribution circuit. The $V_{gate}$ distribution circuit logically combines current control values and an enable signal to produce the output driver leg-enable signals. The leg-enable signals have a logic "1" voltage level equal to $V_{gate}$ voltage. Here, the $V_{gate}$ voltage is regulated by operational amplifier 200. In certain implementations, a single operational amplifier is configured to regulate the $V_{gate}$ voltage for nine output drivers within a byte.

As depicted in FIG. 2, output driver circuit 112 is shown as a single two-transistor stack 210, wherein the bottom transistor is driven by the predriver and the upper transistor is driven by $V_{ictrl}$, which is controlled by signal "Enable_b". When the output driver is active, Enable_b is asserted, and $V_{ictrl}$ is connected to $V_{gate}$ through PMOS transistor 204. When the output driver is inactive, Enable_b is de-asserted, and $V_{ictrl}$ is discharged to ground through NMOS transistor 206. The capacitor "$C_{decouple}$ 208 (e.g., 200–300 pF) is configured to minimize the noise on $V_{ictrl}$.

Operational amplifier 200 is configured as a unity gain buffer that regulates its output to a reference voltage $V_{gRef}$. Voltage $V_{gRef}$ is adjusted to an appropriate level to control the output impedance of output driver circuit 112. Capacitor $C_{vgate}$ 212 at the output of operational amplifier 200 acts to stabilize the regulating operational amplifier.

When the signal Enable_b is asserted, $V_{ictrl}$ is pulled from ground to the level Of $V_{gRef}$, within 10 nS. Operational amplifier 200 has to be designed to have enough transconductance and a fast enough settling time to meet this timing requirement. Operational amplifier 200 also needs to have enough gain to pull $V_{ictrl}$ significantly close to $V_{gRef}$.

A two-stage CMOS operational amplifier 200 is able to provide the large transconductance, fast settling time and high enough gain.

Two-stage operational amplifier techniques are well known and have been published extensively. The most common technique is to use a nulling resistor, pole-splitting capacitor and Miller effect, to generate a zero and to separate the dominant pole and the second order pole. For an exemplary reference, see *MOS Operational Amplifier Design—A tutorial Overview*, by Paul R. Gray and Robert G. Meyer, published in the IEEE Journal Of Solid State Circuits, Vol. SC-17, No. 6, pp. 969–982, December 1982. This article is incorporated herein, by reference.

Figure 3A:
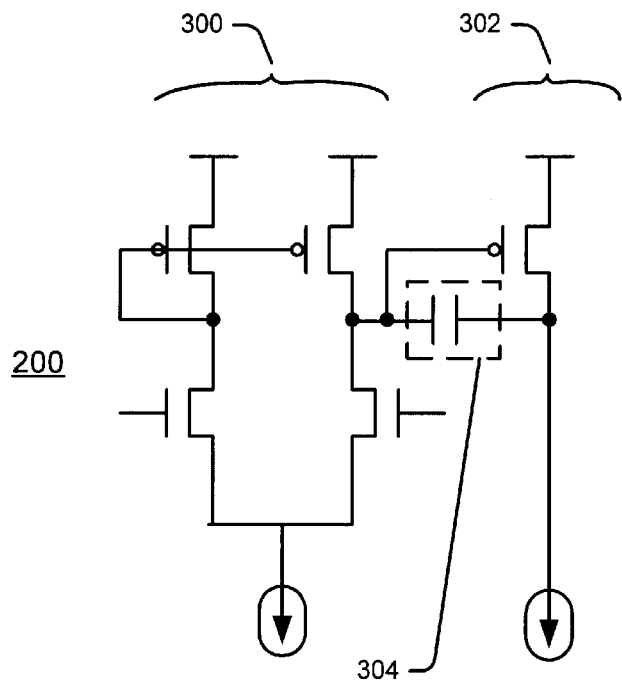
FIGS. 3a–b are schematic diagrams depicting conventional two-stage operational amplifiers having compensation circuits.
Figure 3B:
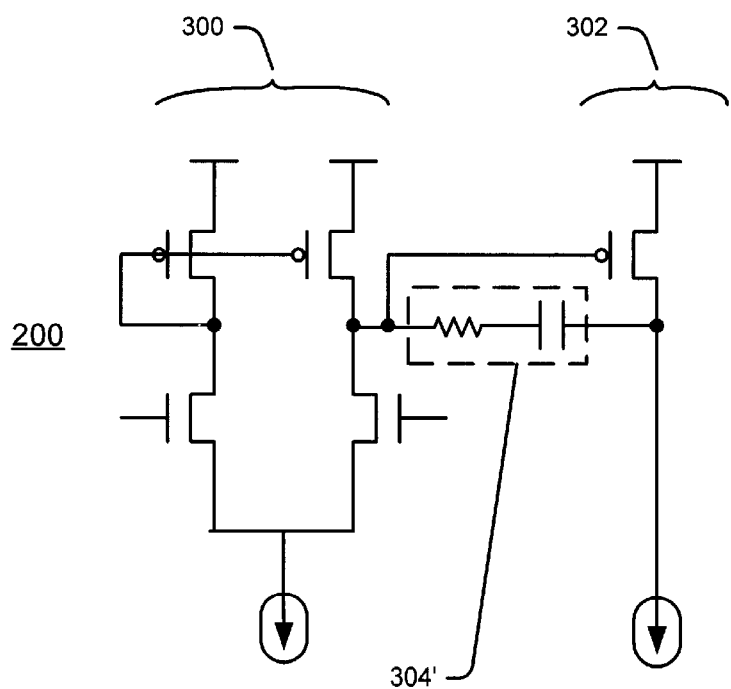

Exemplary schematics of a couple of conventional compensation techniques are provided in FIGS. 3a–b. In FIG. 3a, exemplary operational amplifier 200 includes a first stage 300 and a second stage 302. Here, the necessary compensation 304 is provided by a capacitor. Similarly, exemplary operational amplifier 200 in FIG. 3b includes compensation 304' as provided by a resistor and capacitor.

Compensating a two-stage operational amplifier presents a challenge in a CMOS process that does not include a capacitor layer. One area-effective way to create a capacitor, however, is to utilize the gate capacitance of a MOSFET device with a formed channel. To keep the compensation capacitor turned on, the voltage difference between the two operational amplifier stages must be larger than the MOSFET threshold voltage under all of the process, supply, and temperature conditions. Using conventional compensation techniques, the dominant pole is created by the compensation capacitance. Even with a Miller effect, the compensation capacitance required to create a dominant pole is still large enough when the operational amplifier drives a large load capacitance. It takes a large layout area to create a large compensation capacitance by not using turned-on gate capacitance of a MOSFET device in a CMOS process without a capacitor layer. As a result, in the previous memory module designs to save layout area, the dominant pole is created from the loading of the operational amplifier. Contrary to other techniques the compensation capacitance created a zero and a higher order pole. The zero is used to improve the phase margin of the operational amplifier. In this way, the compensation capacitance value is greatly reduced, resulting in better layout area utilization.

With this in mind, in the output subsystem 112 of FIG. 2, to decouple the noise in $V_{ictrl}$, the value of $C_{decouple}$ 208 is about 300 pF. Depending on whether Enable_b is asserted, regulating operational amplifier 200 sees different capacitances on its output and its dominant pole location varies greatly. For example, at certain times (i.e., when transistor 204 is on) operational amplifier 200 sees both $C_{vgate}$ 212 and $C_{decouple}$ 208, while at other times (i.e., when transistor 204 is off) it only sees $C_{vgate}$ 212.

One possible approach is to design the operational amplifier such that it is well compensated with the minimum output load (i.e., when Enable_b is de-asserted). However, this requires a large capacitance value for $C_{vgate}$ 212, thereby resulting in higher power compensation and a greater layout area. This result would be unacceptable for many applications.

Thus, there is a need for an improved regulating operational amplifier that is suitable for implementation in a CMOS integrated circuitry and perhaps other types of circuitry.

Figure 4A:
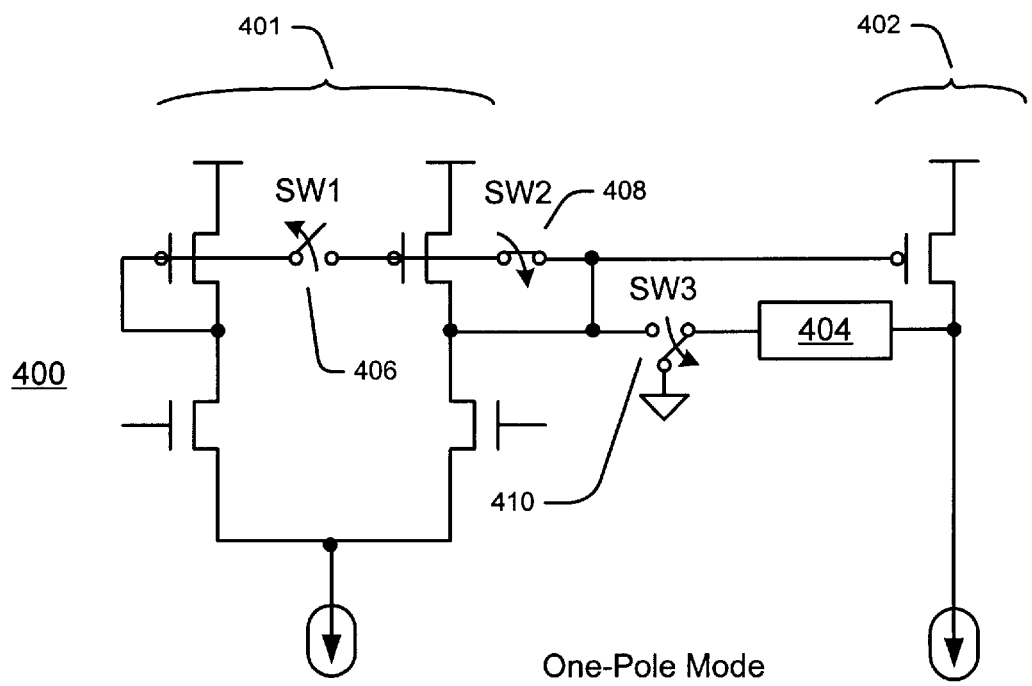
FIGS. 4a–b are simplified schematic diagrams depicting a reconfigurable dual mode multiple stage operational amplifier having a compensation portion, in accordance with certain exemplary implementations of the present invention.
Figure 4B:
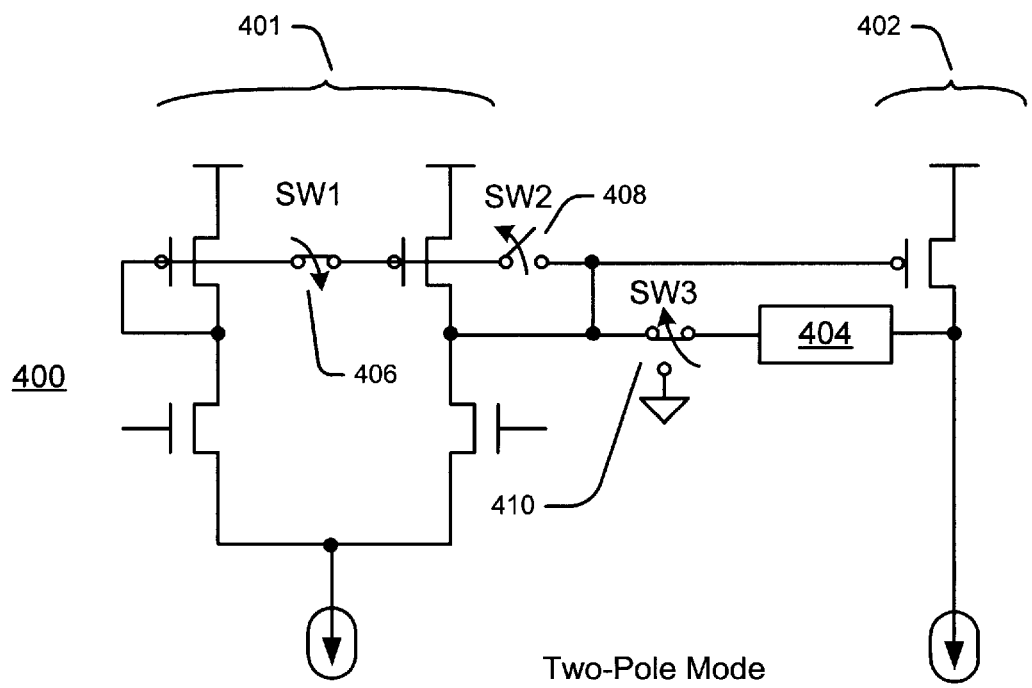

The above stated need and others are satisfied by a reconfigurable dual-mode multiple stage operational amplifier 400. Simplified diagrams are shown in FIGS. 4a–b. Here, operational amplifier 400 changes modes of operation according to the position of three switches (SW1 406, SW2 408 and SW3 410).

As depicted in FIG. 4a, when SW1 406 is open, SW2 408 is closed and SW3 410 is connected to ground, operational amplifier 400 is configured in a single-pole mode.

As depicted in FIG. 4b, when SW1 406 is closed, SW2 408 is open and SW3 410 connects a compensation circuit 404 (e.g., similar to 304/304') between the outputs of the first and second stages, operational amplifier 400 is configured in a two-pole mode.

With reference once again to FIG. 2 (with operational amplifier 400 substituted for operational amplifier 200), when the signal Enable_b is asserted, operational amplifier 400 will see a large output loading. In that case, operational amplifier 400 will be configured in the two-pole mode and stabilized by compensation circuit 404. When Enable_b is de-asserted, operational amplifier 400 will be placed in the one-pole mode (with compensation circuit 404 disabled) to drive the resulting smaller output loading.

In this arrangement, operational amplifier 400 will have sufficient phase margin in both modes and most of the capacitance can be placed on $V_{ictrl}$, to minimize noise. The resulting design is more robust, and area and power efficient.

Furthermore, certain memory devices 102 (FIG. 1) have several power states for power saving features. For example, certain implementations include an "active" mode in which operational amplifier 400 is in a high power state and consumes more current. Operational amplifier 400 can be placed in one-pole mode or two-pole mode depending upon whether Enable_b is asserted. Thus, a high power state could be supported by placing operational amplifier 400 in a two-pole mode. Certain memory devices also have a "standby" mode, wherein operational amplifier 400 could be placed in one-pole mode.

Figure 8A:
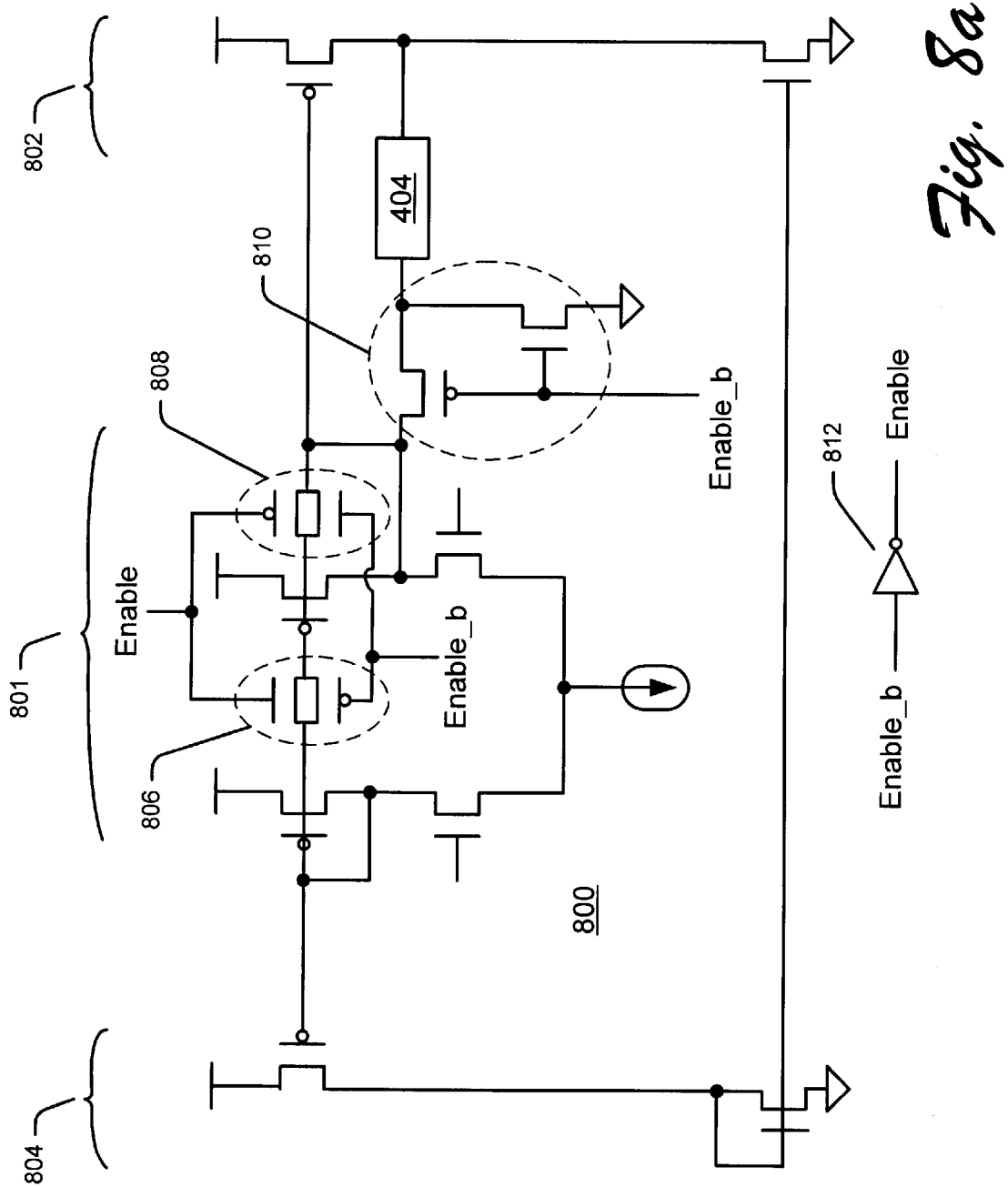
FIGS. 8a–b are more detailed schematic diagrams depicting two different reconfigurable dual mode multiple stage operational amplifiers, as in FIGS. 4a–b, having compensation portions, in accordance with certain exemplary implementations of the present invention.
Figure 8B:
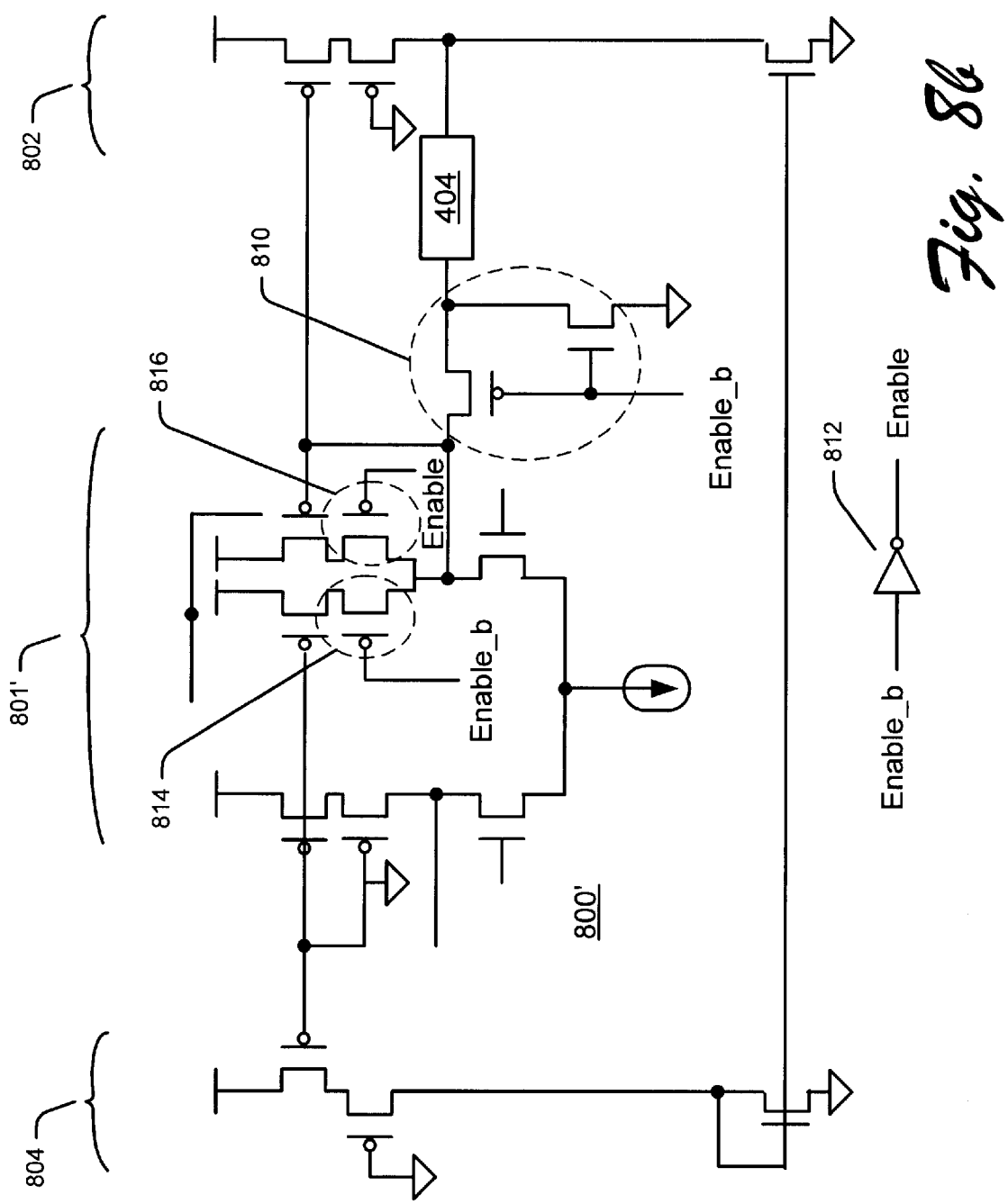

More detailed examples of such operational amplifiers are depicted in FIGS. 8a–b.

FIG. 8a depicts an exemplary operational amplifier 800 having a first stage 801, a second stage 802, a mirroring portion 804, and a compensation circuit 404. Here, with reference back to FIGS. 4a–b, SW1 406 of is provided by transistors 806, SW2 408 is provided by transistors 808, and SW3 410 is provided by transistors 810. Transistors 806, 808 and 810 are each configured to be selectively configured by either an Enable_b signal or the inverted version, Enable. A conventional inversion process is depicted by inverter 812.

FIG. 8b depicts yet another exemplary implementation of an operational amplifier having compensation circuit 404. Here, operational amplifier 800' is provided with a first stage 801' that uses transistors 814, 816 and 810 to act as SW1 406, SW2 408 and SW410, respectively.

Another important aspect of this novel type of reconfigurable dual-mode operational amplifier is that if a simple pulse generator is added, the operational amplifier will work without a compensation circuit.

Figure 5:
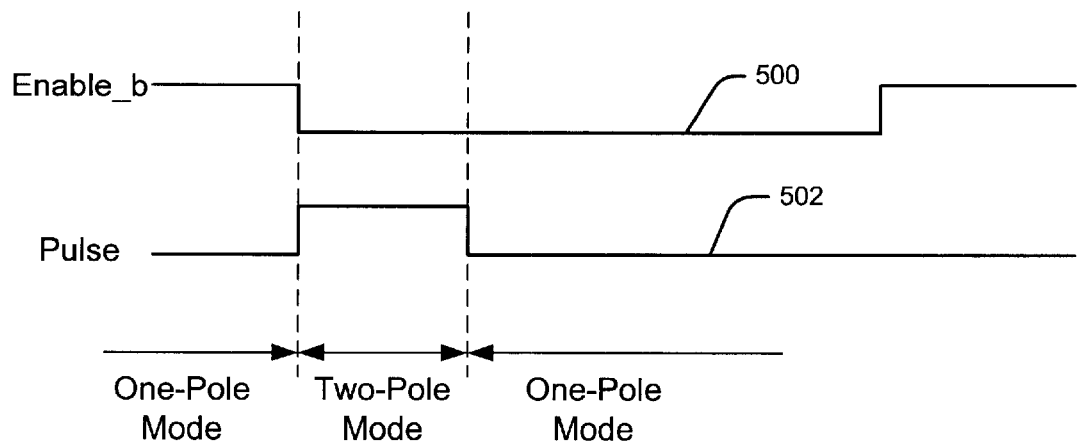
FIG. 5 is a time-line chart depicting exemplary controlling signals for use with a reconfigurable dual mode multiple stage operational amplifier, in accordance with certain other exemplary implementations of the present invention.
Figure 6:
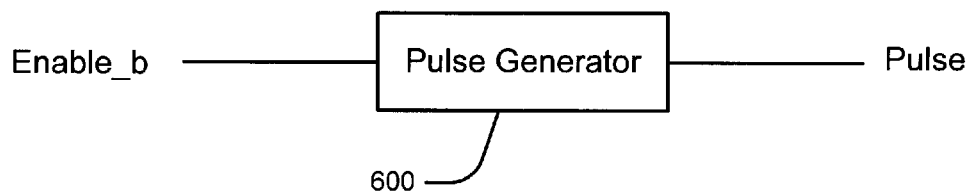
FIG. 6 is a block diagram depicting a pulse-generating portion of a reconfigurable dual mode multiple stage operational amplifier, in accordance with certain exemplary implementations of the present invention.

If an appropriate width of pulse is generated from the edge assertion of signal Enable_b, for example, the pulse can then be used to selectively configure the operational amplifier. A time-line diagram depicting this signal generating process is provided in FIG. 5. Here, a conventional pulse generator 600, as depicted in the block diagram of FIG. 6, generates a pulse signal 502 based on an edge detection of Enable_b signal 500. Thus, during the assertion of the pulse, an operational amplifier 700 (see, FIG. 7b) will be configured in the two-pole mode. In a two-pole mode, operational amplifier 700 exhibits lower output impedance and it can pull the output from ground to a voltage level close to $V_{gRef}$. Since this configuration does not use a compensation circuit, operational amplifier 700 may not have a sufficient phase margin and may ring around the final value at the end of the pulse. However, after the de-assertion of the pulse, operational amplifier 700 (see FIG. 7a) will be configured in the one-pole mode and will have a sufficient phase margin to settle its output to the final value. Thus, eliminating the compensation circuit results in a very simple and robust design.

Figure 7A:
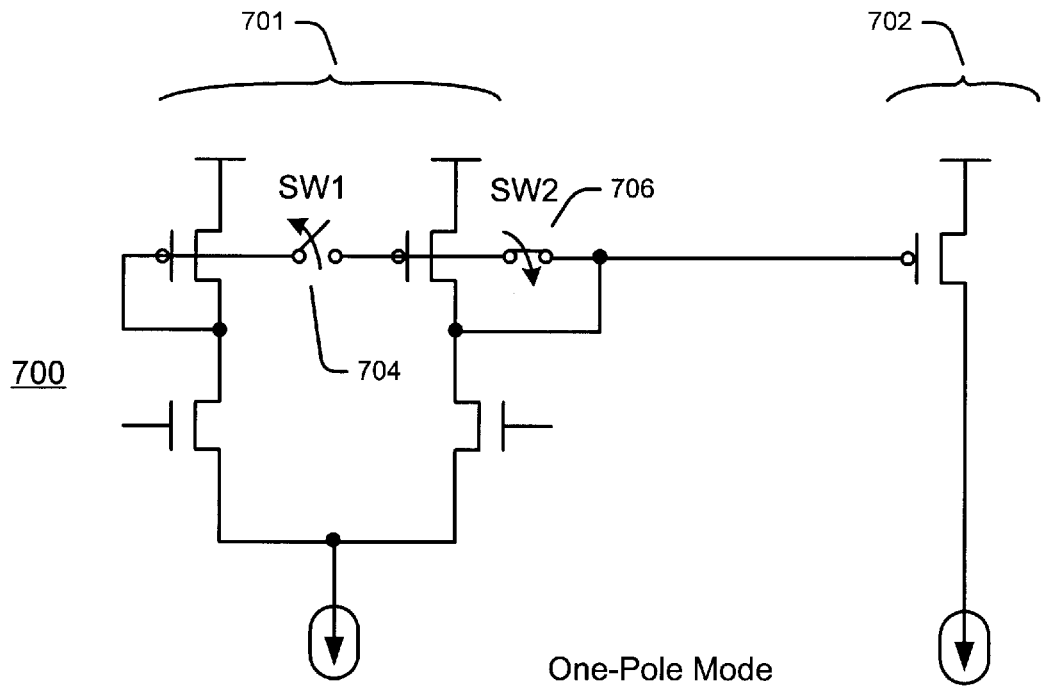
FIGS. 7a–b are simplified schematic diagrams depicting reconfigurable dual mode multiple stage operational amplifiers that do not require compensation portions, in accordance with certain exemplary implementations of the present invention.
Figure 7B:
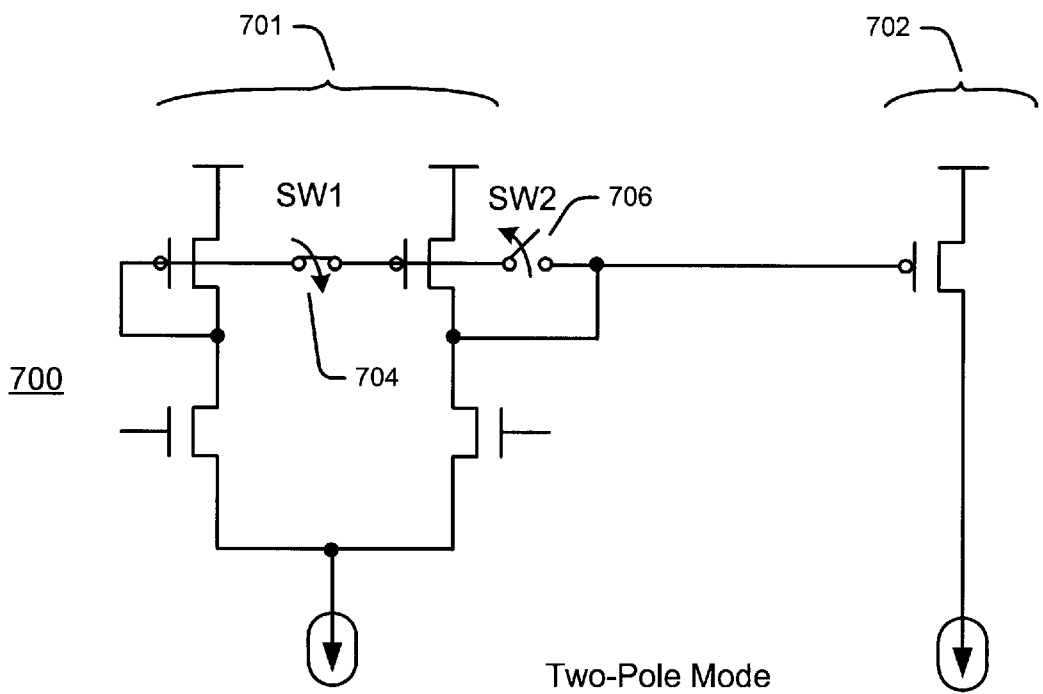

With reference to the diagrams in FIGS. 7a–b, by removing the compensation circuit, the design of operational amplifier 700 has been simplified in that there are only two switches (SW1 704 and SW2 706) in the first stage 701. Note that the second stage 702 is essentially unchanged from second stage 402, with the exception that there is no longer the need for a connection to any compensation components.

Figure 9A:
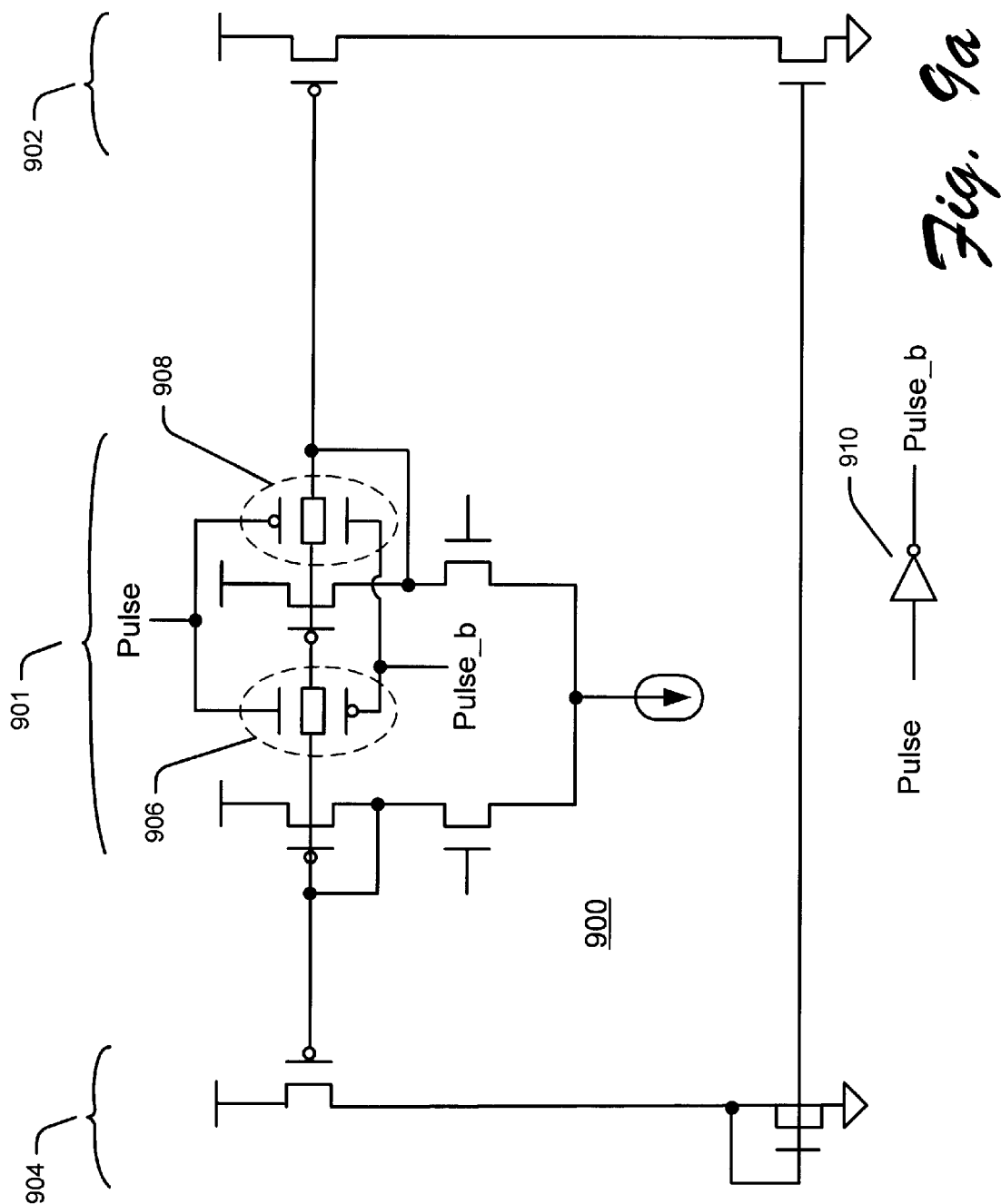
FIGS. 9a–b are more detailed schematic diagrams depicting two different reconfigurable dual mode multiple stage operational amplifiers, as in FIGS. 7a–b, without compensation portions, in accordance with certain further exemplary implementations of the present invention.
Figure 9B:
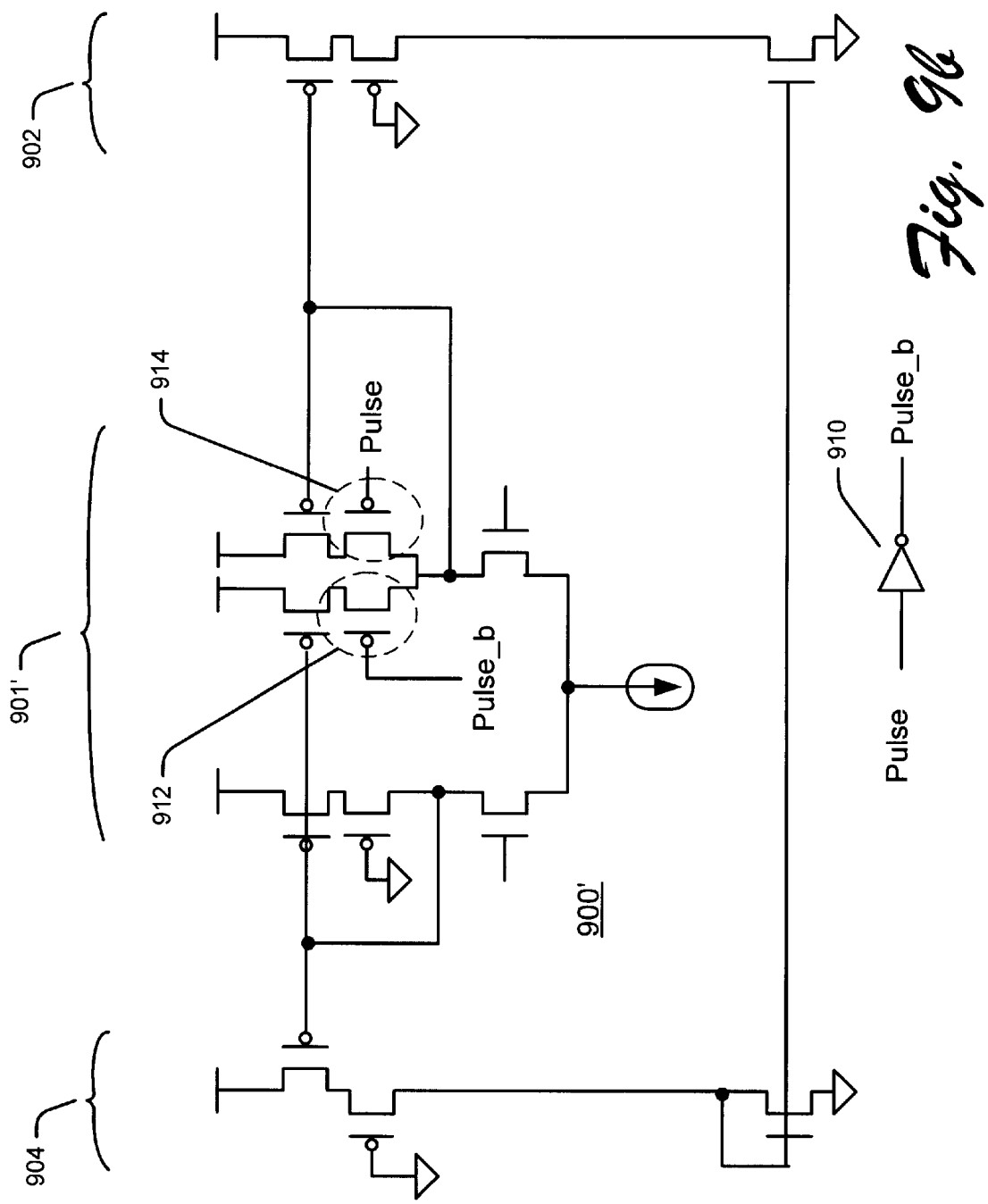

More detailed examples of such alternative operational amplifiers are depicted in FIGS. 9a–b.

FIG. 9a depicts an exemplary operational amplifier 900 (without a compensation circuit) having a first stage 901, a second stage 902, and a mirroring portion 904. Here, SW1 704 of FIGS. 7a–b is provided by transistors 906. Similarly, SW2 706 of FIGS. 7a–b is provided by transistors 908. Transistors 906 and 908 are each arranged to be selectively configured by either a Pulse signal or the inverted version, Pulse_b. A conventional inversion process is depicted by inverter 910.

FIG. 9b depicts yet another exemplary implementation of an operational amplifier without a compensation circuit. Here, operational amplifier 900' is provided with a first stage 901' that uses transistors 912 and 914 to act as SW1 704 and SW2 706, respectively.

Although the above examples have included PMOS and NMOS transistors, the techniques disclosed herein are also adaptable to circuits having other types of transistors, e.g., bipolar transistors, etc.

Although some preferred implementations of the various methods and arrangements of the present invention have been illustrated in the accompanying Drawings and described in the foregoing Detailed Description, it will be understood that the invention is not limited to the exemplary implementations disclosed, but is capable of numerous rearrangements, modifications and substitutions without departing from the spirit of the invention as set forth and defined by the following claims.

What is claimed is:

1. An operational amplifier circuit comprising a configurable portion that can be selectively configured to operate in at least two operational modes including a one-pole mode and a two-pole mode.

2. The operational amplifier circuit as recited in claim 1, wherein the operational amplifier circuit is a multiple stage operational amplifier and the configurable portion is provided in a first stage.

3. The operational amplifier circuit as recited in claim 1, further comprising a compensation portion that can be selectively operatively coupled to the configurable portion, wherein when in the one-pole mode the configurable portion causes the compensation portion to be operatively decoupled from an output of the configurable portion.

4. The operational amplifier as recited in claim 1, further comprising a compensation portion that can be selectively operatively coupled to the configurable portion, wherein when in the two-pole mode the configurable portion causes the compensation portion to be operatively coupled to an output of the configurable portion.

5. The operational amplifier as recited in claim 4, wherein the compensation portion is configured to stabilize a signal on the output of the configurable portion when the configurable portion is in the two-pole mode.

6. The operational amplifier as recited in claim 4, wherein the compensation portion changes the impedance at the output of the configurable portion, when the configurable portion is in the twopole mode.

7. The operational amplifier as recited in claim 1, wherein the configurable portion is configured to switch between the at least two operational modes in response to at least one control signal.

8. The operational amplifier as recited in claim 7, wherein the at least one control signal is selectively asserted by a circuit power controlling process.

9. The operational amplifier as recited in claim 7, fuirther including a pulse generating portion that is coupled to operatively control the configurable portion in response to the at least one control signal.

10. The operational amplifier as recited in claim 9, wherein the pulse generating portion is configured to cause the configurable portion to be placed in the two-pole mode for a set period of time following a change in the at least one control signal.

11. The operational amplifier as recited in claim 10, wherein the pulsegenerating portion is configured to cause the configurable portion to be placed in the one-pole mode after the set period of time.

12. A dual mode multiple-stage operational amplifier comprising:
a first stage having a plurality of selectively enabled switching transistors configured to route signals to at least one output node; and
a second stage operatively and selectively coupled to the at least one output of the first stage via the selectively enabled switching transistors, and
wherein the selectively enabled switching transistors cause the operational amplifier to be selectively placed in at least one of two different operational modes selected from among a one-pole mode and a two-pole mode.

13. The dual mode multiple stage operational amplifier as recited in claim 12, further comprising at least one compensation component that is configured to be selectively coupled between the output of the first stage and an input of the second stage, and wherein the selectively enabled switching transistors cause the compensation component to place an impedance on the output of the first stage when the operational amplifier is placed in the two-pole mode.

14. The dual mode multiple stage operational amplifier as recited in claim 13, wherein the selectively enabled switching transistors cause the compensation component to be electrically isolated from the output of the first stage when the operational amplifier is placed in the one-pole mode.

15. The dual mode multiple stage operational amplifier as recited in claim 12, wherein the selectively enabled switching transistors are operatively controlled by at least one control signal.

16. The dual mode multiple stage operational amplifier as recited in claim 12, wherein the selectively enabled switching transistors include CMOS transistors.

17. A circuit comprising:
   an operational amplifier that can be selectively configured to operate in at least two operational modes including a one-pole mode and a two-pole mode; and
   at least one output driver transistor coupled to an output of the operational amplifier.

18. The circuit as recited in claim 17, wherein the operational amplifier and the at least one output driver transistor are each responsive to an enabling control signal.

19. The circuit as recited in claim 17, wherein the circuit is part of an interface circuit.

20. The circuit as recited in claim 19, wherein the interface circuit is part of a memory module.

21. A method for controlling the amount of electrical energy required in an operational amplifier, the method comprising:
   providing an operational amplifier that can be selectively configured to operate in at least two operational modes including a one-pole mode and a two-pole mode; and
   setting the operational amplifier to operate in the one-pole mode to save electrical energy.

* * * * *

UNITED STATES PATENT AND TRADEMARK OFFICE
CERTIFICATE OF CORRECTION

PATENT NO. : 6,522,199 B2
DATED : February 18, 2003
INVENTOR(S) : Sidiropoulos et al.

It is certified that error appears in the above-identified patent and that said Letters Patent is hereby corrected as shown below:

Column 6,
Line 25, replace "fuirther" with -- further --.

Signed and Sealed this

Thirteenth Day of April, 2004

JON W. DUDAS
*Acting Director of the United States Patent and Trademark Office*